United States Patent
Sarracanie et al.

(10) Patent No.: US 10,317,501 B2
(45) Date of Patent: Jun. 11, 2019

(54) SYSTEM AND METHOD FOR MAGNETIC RESONANCE FINGERPRINTING IN THE PRESENCE OF INHOMOGENEOUS MAGNETIC FIELDS

(71) Applicant: THE GENERAL HOSPITAL CORPORATION, Boston, MA (US)

(72) Inventors: Mathieu Sarracanie, Basel (CH); Matthew Rosen, Somerville, MA (US); Ouri Cohen, Teaneck, NJ (US); Lionel Broche, Aberdeen (GB)

(73) Assignee: The General Hospital Corporation, Boston, MA (US)

(*) Notice: Subject to any disclaimer, the term of this patent is extended or adjusted under 35 U.S.C. 154(b) by 126 days.

(21) Appl. No.: 15/660,221

(22) Filed: Jul. 26, 2017

(65) Prior Publication Data

US 2018/0031667 A1    Feb. 1, 2018

Related U.S. Application Data

(60) Provisional application No. 62/366,812, filed on Jul. 26, 2016.

(51) Int. Cl.
*G01R 33/565* (2006.01)
*G01R 33/561* (2006.01)
*G01R 33/48* (2006.01)
*G01R 33/36* (2006.01)

(52) U.S. Cl.
CPC ... *G01R 33/56563* (2013.01); *G01R 33/3614* (2013.01); *G01R 33/482* (2013.01); *G01R 33/5615* (2013.01); *G01R 33/5659* (2013.01); *G01R 33/5616* (2013.01)

(58) Field of Classification Search
CPC .......... G01R 33/56563; G01R 33/3614; G01R 33/482; G01R 33/5615; G01R 33/5659; G01R 33/5616
See application file for complete search history.

(56) References Cited

U.S. PATENT DOCUMENTS

| | | | |
|---|---|---|---|
| 7,337,205 B2* | 2/2008 | Sazegari | G06F 17/16 708/607 |
| 2012/0235678 A1* | 9/2012 | Seiberlich | G01R 33/56 324/307 |
| 2016/0349342 A1* | 12/2016 | Cohen | G01R 33/543 |

* cited by examiner

*Primary Examiner* — Gregory H Curran
(74) *Attorney, Agent, or Firm* — Quarles & Brady LLP

(57) ABSTRACT

Systems and methods for magnetic resonance fingerprinting ("MRF") using highly differentiated trajectories that optimize differentiation between magnetic resonance signal patterns as a function of relaxation time(s) and static magnetic field homogeneity are described. Using the optimized acquisition parameters, MRF can be performed in the presence of inhomogeneous magnetic fields. Flip angle homogeneity can also be incorporated into the dictionary matching process to simultaneously estimate quantitative parameters of the subject and radio frequency coil transmission homogeneity profiles.

13 Claims, 3 Drawing Sheets

SYSTEM AND METHOD FOR MAGNETIC RESONANCE FINGERPRINTING IN THE PRESENCE OF INHOMOGENEOUS MAGNETIC FIELDS

CROSS-REFERENCE TO RELATED APPLICATIONS

This application claims the benefit of U.S. Provisional Patent Application Ser. No. 62/366,812, filed on Jul. 26, 2016, and entitled "System and Method for Magnetic Resonance Fingerprinting in the Presence of Inhomogeneous Magnetic Fields."

STATEMENT REGARDING FEDERALLY SPONSORED RESEARCH

This invention was made with government support under W81XWH-11-2-076 awarded by the Department of Defense. The government has certain rights in the invention.

BACKGROUND

Magnetic resonance fingerprinting ("MRF") is an imaging technique that enables quantitative mapping of tissue or other material properties based on random or pseudorandom measurements of the subject or object being imaged. Examples of parameters that can be mapped include longitudinal relaxation time, $T_1$; transverse relaxation time, $T_2$; main magnetic field map, $B_0$; and proton density, $\rho$. MRF is generally described in U.S. Pat. No. 8,723,518, which is herein incorporated by reference in its entirety.

The random or pseudorandom measurements obtained in MRF techniques are achieved by varying the acquisition parameters from one repetition time ("TR") period to the next, which creates a time series of images with varying contrast. Examples of acquisition parameters that can be varied include flip angle, radio frequency ("RF") pulse phase, TR, echo time ("TE"), and sampling patterns, such as by modifying one or more readout encoding gradients.

The data acquired with MRF techniques are compared with a dictionary of signal models, or templates, that have been generated for different acquisition parameters from magnetic resonance signal models, such as Bloch equation-based physics simulations. This comparison allows estimation of the desired physical parameters, such as those mentioned above. The parameters for the tissue or other material in a given voxel are estimated to be the values that provide the best signal template matching.

There remains a need, however, for an MRF acquisition that is accurate in the presence of inhomogeneous static magnetic fields, $B_0$, and RF transmit fields, $B_1$.

SUMMARY OF THE DISCLOSURE

The present disclosure addresses the aforementioned drawbacks by providing a method for using a magnetic resonance imaging ("MRI") system to estimate quantitative parameters of a subject in the presence of inhomogeneous magnetic fields. Optimized acquisition parameters are estimated. The acquisition parameters are optimized to direct the MRI system to generate a plurality of different signal evolutions that maximize discrimination between magnetic resonance signal patterns in a minimized number of repetition time ("TR") periods as a function of at least one relaxation time parameter and magnetic field homogeneity. Data are acquired with the MRI system by directing the MRI system to perform a plurality of pulse sequences using the optimized acquisition parameters, the acquired data representing the plurality of different signal evolutions. Quantitative parameters of the subject are computed by comparing the acquired data with a dictionary database comprising a plurality of different signal templates, wherein each signal template includes values associated with flip angle homogeneity. In some examples, radio frequency ("RF") coil transmission homogeneity profiles are also simultaneously computed with the quantitative parameters based on a comparison of the acquired data with the flip angle homogeneity values in the dictionary database.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
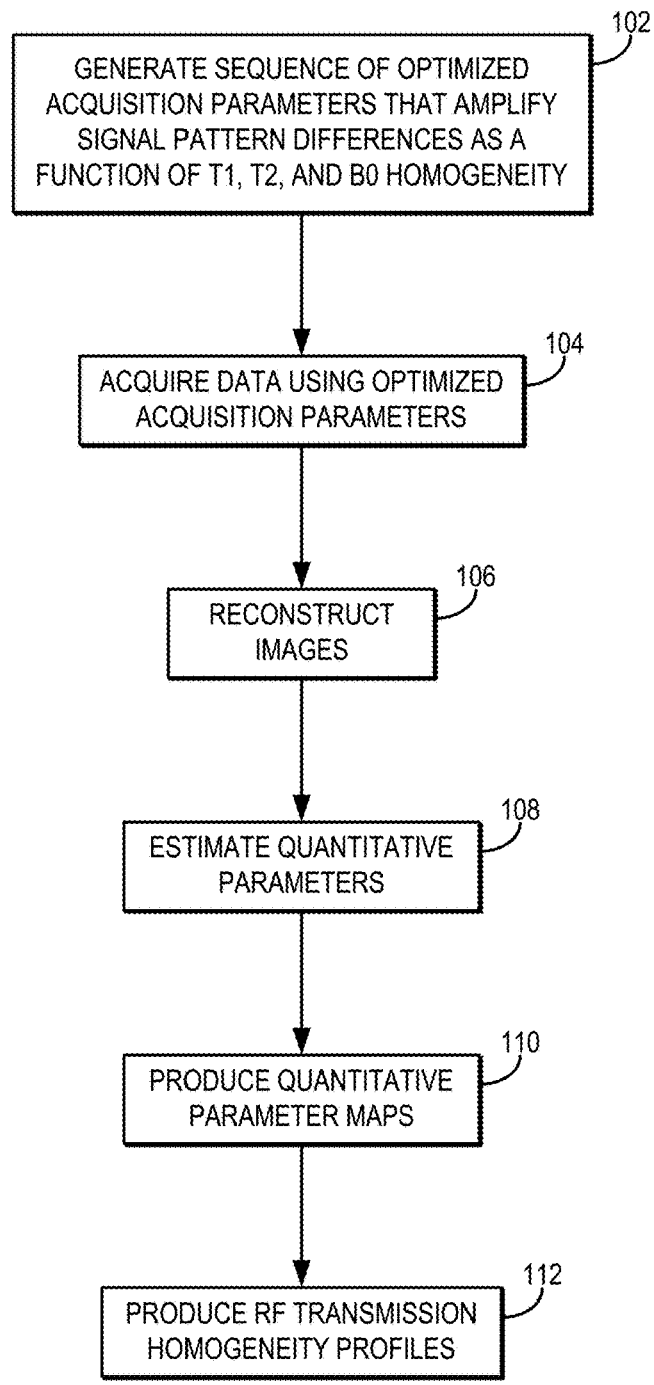
FIG. 1 is a flowchart setting forth the steps of an example method for using magnetic resonance fingerprinting ("MRF") to estimate quantitative parameters from data acquired using acquisition parameters that have been optimized to reduce the number of acquisitions necessary to maximize the discrimination between signal patterns as a function of relaxation time and static magnetic field homogeneity values.

Described here are systems and methods for magnetic resonance fingerprinting ("MRF") using highly differentiated trajectories. Advantageously, the systems and methods described here can provide accurate MRF even in the presence of inhomogeneous magnetic fields.

In general, MRF techniques utilize a data acquisition scheme that causes signals from different materials or tissues to be spatially and temporally incoherent by continuously varying acquisition parameters throughout the data acquisition process. Examples of acquisition parameters that can be varied include flip angle ("FA"), radio frequency ("RF") pulse phase, repetition time ("TR"), echo time ("TE"), and sampling patterns, such as by modifying readout encoding gradients. In typical MRF approaches, the acquisition parameters are generally varied in a pseudorandom manner.

As a result of the spatial and temporal incoherence imparted by an acquisition scheme utilizing multiple parameter values, each material or tissue is associated with a unique signal evolution or "fingerprint," that is a function of multiple different physical parameters, including longitudinal relaxation time, $T_1$; transverse relaxation time, $T_2$; main magnetic field map, $B_0$; and proton density, $\rho$.

Quantitative parameter maps are then generated from the acquired signals based on a comparison of the signals to a predefined dictionary of predicted signal evolutions. Each of these dictionaries is associated with different combinations of materials and acquisition parameters. As an example, the comparison of the acquired signals to a dictionary can be performed using any suitable matching or pattern recognition technique. This comparison results in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The systems and methods described here generate an optimized, ultra-short sequence of FA and TR values that amplifies signal pattern differences as a function of relaxation times (e.g., $T_1$, $T_2$) and static magnetic field (e.g., $B_0$) homogeneity. The resulting optimized sequence of FA and TR values is robust to static magnetic field variations, and therefore offers high signal discrimination among nuclear spin species, even in the presence of inhomogeneous magnetic fields. Because the optimized sequence of FA and TR values significantly reduces the number of data points implemented in the MRF pulse sequence, Cartesian data acquisitions can be utilized.

The optimization used to determine the sequence of FA and TR values can also be designed to maintain signal-to-noise ratio ("SNR") in the acquired signal patterns above a minimum threshold value, which may include imposing one or more penalty terms. As one example of maintaining a minimum SNR, the optimization can be limited to search for trajectories with flip angles above a certain minimum value (e.g., 10 or 15 degrees), or for trajectories with echo time ("TE") or TR values within a certain range of values.

In another example, a penalty term can be added to the optimization to maximize the average transverse magnetization of a given trajectory. In low SNR situations (e.g., where there is little to no magnetization in the transverse plane), it can be difficult to discriminate between different signal patterns. Thus, adding a penalty term that enforces maximization of transverse magnetization results in changes in signal above the noise floor, which allows for discrimination between different signal patterns. As another example of a penalty term that can be used to maintain a minimum SNR, deviations of the on-diagonal elements from a value of 1 can be penalized. For the latter example, in a noiseless scenario the on-diagonal elements should be exactly 1, so any deviation from would be the result of noise.

During the MRF matching process, FA homogeneity is accounted for in the dictionary, thereby allowing for recovery of coil homogeneity profiles in addition to quantitative parameters. Adding FA homogeneity to the dictionary also enhances the accuracy of the matching process by adding another quantitative parameter in addition to $T_1$, $T_2$, $\rho$ (proton density), and off-resonance.

The systems and methods described here allow for quantitative magnetic resonance imaging ("MRI") in the presence of very inhomogeneous static magnetic fields, using very inhomogeneous RF transmitters, or both. Typical MRI scanners require highly homogeneous static magnetic fields and RF coils, which increases the total cost of the MRI system hardware.

The ability to provide quantitative MRI in the presence of inhomogeneous magnetic fields would allow the development of new MRI scanners where hardware cost can be greatly reduced by relaxing the requirements on the static magnetic field and RF coil homogeneity. In addition to reduced cost, relaxing these homogeneity requirements could allow for the design of lightweight, portable imaging devices.

Referring now to FIG. 1, a flowchart is illustrated as setting forth the steps of one non-limiting example method for producing a quantitative parameter map from data acquired using acquisition parameters that have been selected to reduce the number of acquisitions necessary to desirably sample the relaxation parameter space. The method begins by generating a vector, or schedule, of acquisition parameters that has been selected to reduce the number of acquisitions necessary to sufficiently sample the relaxation parameter space while also amplifying signal pattern differences as a function of relaxation time and static magnetic field homogeneity, as indicated at step 102.

Preferably, the sequence of acquisition parameters (e.g., FA and TR) is selected to be symmetric, such as temporally symmetric. By using a symmetric sequence of acquisition parameters, nuclear spin magnetization will be at least partially rewound back to its original state at the end of each pulse sequence. In the symmetrical sequence, the FA and TR series are played back half way through the imaging sequence, which as stated above partially rewinds the spins (e.g., to get back to the initial position of longitudinal magnetization). By incorporating this symmetry into the acquisition parameters, acquisition sequences can follow in rapid succession without having to wait as long between sequences for magnetization recovery.

By way of example, the selection or optimization of acquisition parameters, such as FA and TR, may include providing an initial, randomly-generated seed vector of the acquisition parameters to be selected or optimized. This seed vector may have a length, N, and may be used to simulate the signal for a range, P, of relaxation parameters and static magnetic field homogeneity values. In some examples, a first range, $P_1$, of $T_1$ values can be used together with a second range, $P_2$, of $T_2$ values and a third range, $P_3$, of $B_0$ values. In other examples, combinations of ranges of these parameters can be used (e.g., a range of only one relaxation time parameter and a range of static magnetic field homogeneity values). The seed vector and simulated relaxation parameters are used to form an N×P matrix, A, where $$P = \sum_{i=1}^{M} P_m$$

for the M different ranges. This matrix, A, can then be used to calculate a dot product matrix, $$D = A^T A \qquad (1).$$

The diagonal elements of this dot product matrix, D, indicate the closeness of a match between a schedule resulting from a given relaxation parameter or static magnetic field homogeneity value and itself. The diagonal elements are, therefore, equal to one. The off-diagonal elements of the dot product matrix, D, however, indicate the quality of matching between every two different elements of the matrix, A. Discriminating between $T_1$, $T_2$, and $B_0$ homogeneity values in the matching process requires that the dot product of a measured trajectory with the pre-computed trajectory that is stored in the dictionary be high for the correct $T_1$, $T_2$, and $B_0$ homogeneity values and, ideally, zero for all others. To find the vector of acquisition parameters (e.g., FAs and TRs) that yield this optimum value, or a value that is otherwise sufficiently desirable, a model can be utilized. One non-limiting example of a model is the following optimization problem:

$$\min_x f(x) \text{ such that } \sum_{i \neq j} D_{ij}(x) - \lambda \sum_{i=j} D_{ij}(x); \quad (2)$$

where f(x) is the function to simulate the schedule and compute the dot product matrix, D, given a vector, x, of acquisition parameters. A penalty term, λ, is applied as well to avoid minimizing the on-diagonal elements. In some other examples, another penalty term can be added to Eqn. (2) to maintain an SNR value above a minimum threshold value. Another non-limiting example of a model that can be used is:

$$\min_x f(x) = \frac{\sum_{i \neq j} D_{ij}(x)}{\sum_{i=j} D_{ij}(x)}; \quad (3)$$

where the ratio of off-diagonal to diagonal elements is minimized. As one example, a constrained non-linear solver can be used to solve Eqns. (2) or (3).

Using the optimized schedule reduces the total number of acquisitions needed to sufficiently sample the physical parameter space, but also samples this physical parameter space in a manner that increases the discrimination between different parameters, thereby reducing the scan time required to perform MRF. Additional time savings can be achieved by using rapid data acquisition schemes, such as EPI and segmented EPI.

Referring again to FIG. 1, the method for estimating quantitative parameters continues by acquiring data by directing an MRI system to perform pulse sequences using the optimized acquisition parameters, as indicated at step 104. The pulse sequence can be any suitable pulse sequence for obtaining MRF data, but in some embodiments the pulse sequence used can be an EPI pulse sequence, which may be a spin-echo ("SE") EPI sequence or a gradient-recalled echo ("GRE") EPI sequence.

Using an EPI pulse sequence has the added benefit that k-space can be fully sampled in a rapid fashion, which reduces the total number of required acquisitions, and therefore contrast doses. Reducing the total number of acquisitions not only provides a time saving measure, but also reduces the computational burden of matching the acquired data to a pre-computed dictionary because a smaller dictionary can be used with the reduced number of acquisitions.

The method continues by reconstructing images from the acquired data, as indicated at step 106. When an EPI sequence, or other pulse sequence, that sampled k-space along a Cartesian trajectory is used to acquire the data, reconstruction can be achieved using a conventional Fourier transform-based reconstruction, which introduces another reduction in the computational burden compared to conventional MRF applications that require complex reconstruction techniques to reconstruct images from data acquired using non-Cartesian trajectories.

Quantitative parameter maps are then estimated by, for example, matching the reconstructed images to one or more pre-computed dictionaries, as indicated at step 108. Conventional matching algorithms can be used; however, in some configurations, an adaptive matching algorithm, such as the one described in co-pending PCT Application No. PCT/US15/11948, which is herein incorporated by reference in its entirety, can also be used. From these estimated quantitative parameters, quantitative parameter maps can be generated by associating the estimated quantitative parameters with spatial locations in the imaged field-of-view, as indicated at step 110.

In some examples, the pre-computed dictionaries include additional entries associated with FA homogeneity values. Using such dictionaries not only increases the accuracy of the matching process in the presence of inhomogeneous magnetic fields and when using inhomogeneous RF transmitters, but can provide for the simultaneous estimation of coil profiles in addition to quantitative parameter maps. Thus, in some examples RF coil transmission homogeneity profiles are simultaneously estimated with the quantitative parameter maps, as indicated at step 112.

Figure 2:
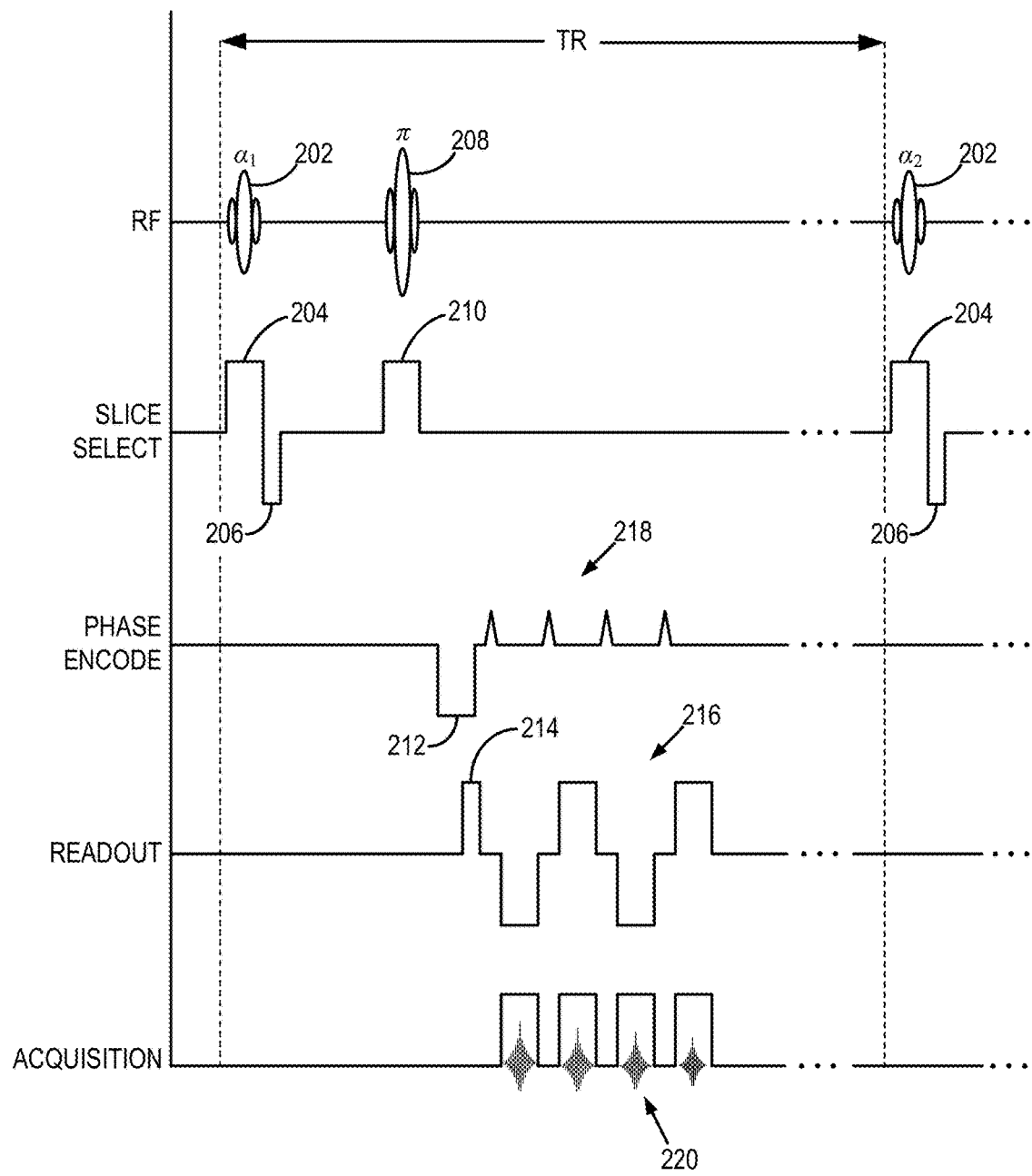
FIG. 2 is an example echo-planar imaging ("EPI") pulse sequence that can be used to acquire data using an optimized set of acquisition parameters and from which quantitative parameters can be estimated using MRF.

Referring now to FIG. 2, an example pulse sequence diagram of a modified spin-echo EPI technique for use in accordance with some implementations of the systems and methods described in the present disclosure, is shown. Specifically, for each TR, a selective RF excitation pulse 202 is played out in the presence of a slice select gradient pulse 204. In general spin-echo EPI sequences, the flip angle, a, values of the RF excitations are usually 90 degrees to maximize the signal to noise ratio ("SNR"). By contrast, the present disclosure employs a variable FA, a, that may be varied according to the optimized acquisition parameters, unlike previous MRF approaches that utilize pseudo-randomized parameter values.

The slice select gradient pulse 204 is followed by a rephasing pulse 206, which operates to rephase excited spins in the selected slice. Subsequently, to facilitate the formation of spin echoes, the orientation of the transverse magnetization of excited spins may be reversed by application of a selective 180 degree RF excitation pulse 208 produced in the present of a slice select gradient pulse 210. Readout and phase-encoding waveforms are played following RF excitation 202 to produce a series of spatially encoded echoes 220. Specifically, following a phase encode pre-phase pulse 212 and readout pre-phase pulse 214 that determine a starting k-space sampling position, a plurality of gradient waveforms are played out for traversing k-space in accordance with a desired trajectory. In some configurations, this trajectory is a Cartesian k-space trajectory.

Following the readout pre-phase gradient pulse 214, a series of readout gradient pulses 216 with alternating polarity are played along the readout direction to produce a series of spin-echo signals 220. Specifically, the readout gradient pulses 216 are spaced apart, and phase-encoding gradient blips 218 are played out therebetween to separately phase encode each acquired echo 220. In particular, there is a separate readout gradient pulse 216 and phase-encoding gradient blip 218 for each view of k-space that is to be acquired. In this manner, multiple views may be acquired for each excitation in the TR, to encompass either k-space segments or fully sample k-space in accordance with the Nyquist criterion. Advantageously, fully sampled k-space on a Cartesian grid avoids a regridding and simplifies the reconstruction process.

Depending on the duration of the TR, in accordance with aspects of the present disclosure, multiple slices may be acquired during each scan. For instance, delays associated with wait times necessary for magnetization recovery of successive phase encoding k-space lines may limit total scan times. Thus, in certain applications, these otherwise dead times may be utilized for acquisition of multiple slices to facilitate three-dimensional ("3D") data acquisition. For instance, in some embodiments, a segmented EPI sequence may also be used, depending on the desired resolution and tissue parameter values. For such acquisitions, a wait time, $\Delta T$, may be needed following each segment to ensure the initial magnetization is the same for all segments. During the wait time, additional slices can be acquired, for example, if 3D acquisition is desired. As such, after a last phase-encoding k-space line of a segment is acquired for a particular slice, additional k-space segments from other slices may be interleaved therein.

In the manner described, multiple acquisitions can be performed, wherein scan parameter values for each acquisition can vary from one excitation to the next. For example, ten acquisitions can take place in a manner described above, although other values are possible. In some aspects, TR, FA, and other parameter values may be varied in accordance with optimized or desired trajectories, such as those described above; in a random manner; or in a pseudorandom manner. The parameters can be varied sequentially, simultaneously, or in accordance with a differential sensitivity requirement for specific parameters of interest.

Figure 3:
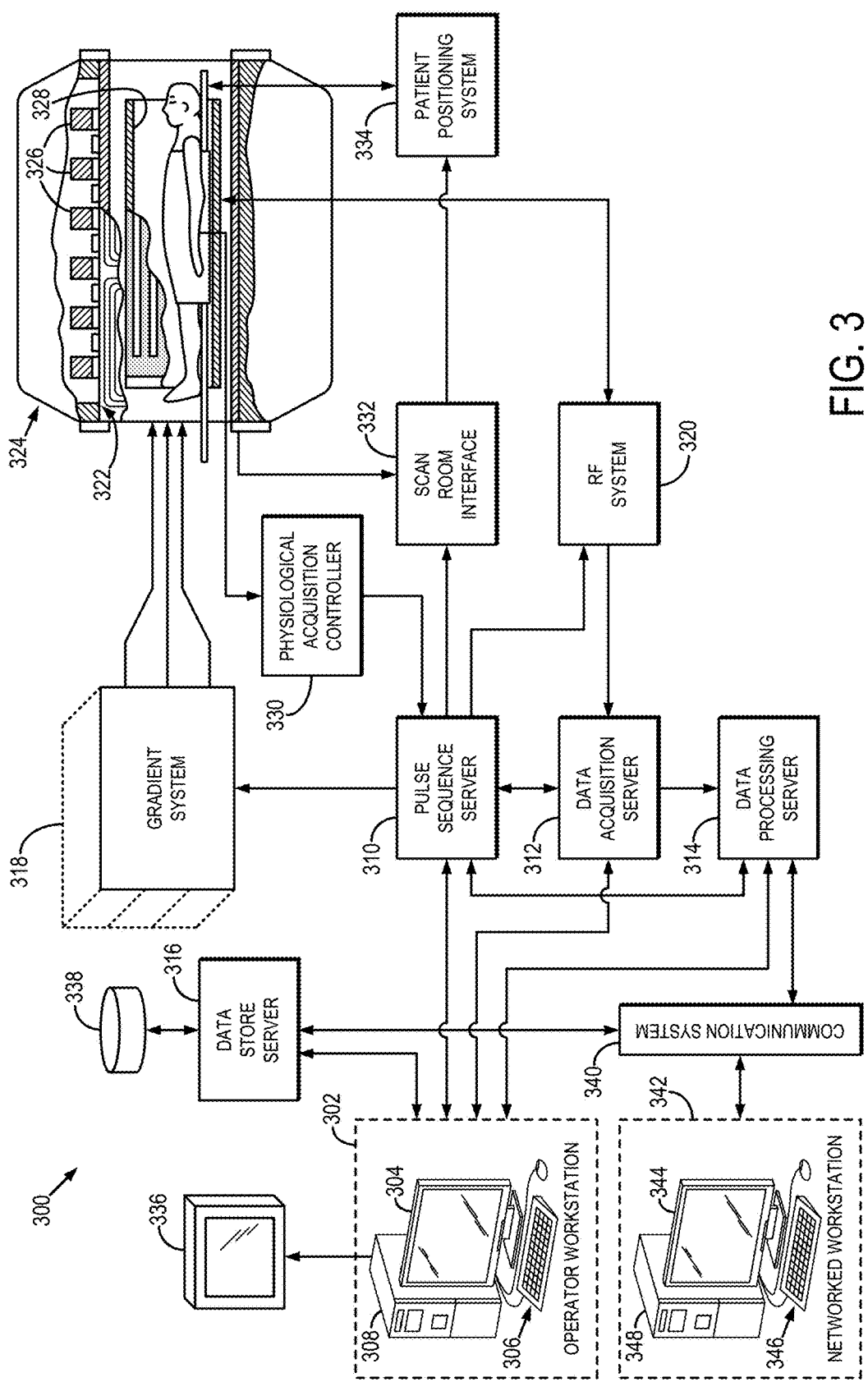
FIG. 3 is a block diagram of an example of a magnetic resonance imaging ("MRI") system.

Referring particularly now to FIG. 3, an example of a magnetic resonance imaging ("MRI") system 300 that can implement the methods described here is illustrated. The MRI system 300 includes an operator workstation 302 that may include a display 304, one or more input devices 306 (e.g., a keyboard, a mouse), and a processor 308. The processor 308 may include a commercially available programmable machine running a commercially available operating system. The operator workstation 302 provides an operator interface that facilitates entering scan parameters into the MRI system 300. The operator workstation 302 may be coupled to different servers, including, for example, a pulse sequence server 310, a data acquisition server 312, a data processing server 314, and a data store server 316. The operator workstation 302 and the servers 310, 312, 314, and 316 may be connected via a communication system 340, which may include wired or wireless network connections.

The pulse sequence server 310 functions in response to instructions provided by the operator workstation 302 to operate a gradient system 318 and a radiofrequency ("RF") system 320. Gradient waveforms for performing a prescribed scan are produced and applied to the gradient system 318, which then excites gradient coils in an assembly 322 to produce the magnetic field gradients $G_x$, $G_y$, and $G_z$ that are used for spatially encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil to perform the prescribed magnetic resonance pulse sequence. Responsive magnetic resonance signals detected by the RF coil 328, or a separate local coil, are received by the RF system 320. The responsive magnetic resonance signals may be amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the prescribed scan and direction from the pulse sequence server 310 to produce RF pulses of the desired frequency, phase, and pulse amplitude waveform. The generated RF pulses may be applied to the whole-body RF coil 328 or to one or more local coils or coil arrays.

The RF system 320 also includes one or more RF receiver channels. An RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (4);$$

and the phase of the received magnetic resonance signal may also be determined according to the following relationship:

$$\varphi = \tan^{-1}\left(\frac{Q}{I}\right). \qquad (5)$$

The pulse sequence server 310 may receive patient data from a physiological acquisition controller 330. By way of example, the physiological acquisition controller 330 may receive signals from a number of different sensors connected to the patient, including electrocardiograph ("ECG") signals from electrodes, or respiratory signals from a respiratory bellows or other respiratory monitoring devices. These signals may be used by the pulse sequence server 310 to synchronize, or "gate," the performance of the scan with the subject's heart beat or respiration.

The pulse sequence server 310 may also connect to a scan room interface circuit 332 that receives signals from various sensors associated with the condition of the patient and the magnet system. Through the scan room interface circuit 332, a patient positioning system 334 can receive commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, so that data is not lost by data overrun. In some scans, the data acquisition server 312 passes the acquired magnetic resonance data to the data processor server 314. In scans that require information derived from acquired magnetic resonance data to control the further performance of the scan, the data acquisition server 312 may be programmed to produce such information and convey it to the pulse sequence server 310. For example, during pre-scans, magnetic resonance data may be acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also process magnetic resonance signals used to detect the arrival of a contrast agent in a magnetic resonance angiography ("MRA") scan. For example, the data acquisition server 312 may acquire magnetic resonance data and processes it in real-time to produce information that is used to control the scan.

The data processing server 314 receives magnetic resonance data from the data acquisition server 312 and processes the magnetic resonance data in accordance with instructions provided by the operator workstation 302. Such processing may include, for example, reconstructing twodimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 314 are conveyed back to the operator workstation 302 for storage. Real-time images may be stored in a data base memory cache, from which they may be output to operator display 302 or a display 336. Batch mode images or selected real time images may be stored in a host database on disc storage 338. When such images have been reconstructed and transferred to storage, the data processing server 314 may notify the data store server 316 on the operator workstation 302. The operator workstation 302 may be used by an operator to archive the images, produce films, or send the images via a network to other facilities.

The MRI system 300 may also include one or more networked workstations 342. For example, a networked workstation 342 may include a display 344, one or more input devices 346 (e.g., a keyboard, a mouse), and a processor 348. The networked workstation 342 may be located within the same facility as the operator workstation 302, or in a different facility, such as a different healthcare institution or clinic.

The networked workstation 342 may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342.

The present disclosure has described one or more preferred embodiments, and it should be appreciated that many equivalents, alternatives, variations, and modifications, aside from those expressly stated, are possible and within the scope of the invention.

The invention claimed is:

1. A method for using a magnetic resonance imaging (MRI) system to estimate quantitative parameters of a subject in a presence of inhomogeneous magnetic fields, the steps of the method comprising:
   (a) estimating optimized acquisition parameters that are optimized to direct the MRI system to generate a plurality of different signal evolutions that maximize discrimination between magnetic resonance signal patterns in a minimized number of repetition time (TR) periods as a function of at least one relaxation time parameter and magnetic field homogeneity;
   (b) acquiring data with the MRI system by directing the MRI system to perform a plurality of pulse sequences using the optimized acquisition parameters, the acquired data representing the plurality of different signal evolutions;
   (c) computing quantitative parameters of the subject by comparing the acquired data with a dictionary database comprising a plurality of different signal templates, wherein each signal template includes values associated with flip angle homogeneity.

2. The method as recited in claim 1, wherein step (a) includes estimating the acquisition parameters by minimizing an objective function that simulates the acquisition parameters and computes a matrix that is based on estimated values of the acquisition parameters and the quantitative parameters to be estimated.

3. The method as recited in claim 2, wherein the objective function minimized in step (a) includes a penalty term that maintains a signal-to-noise ratio (SNR) of the plurality of different signal evolutions above a minimum threshold value.

4. The method as recited in claim 2, wherein step (a) includes selecting initial estimates of the acquisition parameters and forming the matrix based on the initial estimates.

5. The method as recited in claim 4, wherein the initial estimates of the acquisition parameters are selected by randomly generating values for the acquisition parameters.

6. The method as recited in claim 2, wherein the computed matrix comprises a first matrix that defines a dot product between a second matrix and a transpose of the second matrix, wherein the second matrix includes estimates of the acquisition parameters, and simulated values for the quantitative parameters.

7. The method as recited in claim 1, wherein at least some of the plurality of pulse sequences sample k-space along a Cartesian trajectory.

8. The method as recited in claim 7, wherein at least some of the plurality of pulse sequences are echo planar imaging (EPI) pulse sequences that sample k-space along a Cartesian trajectory.

9. The method as recited in claim 8, wherein the EPI pulse sequences are segmented EPI pulse sequences that sample less than a full extent of k-space.

10. The method as recited in claim 8, wherein the EPI pulse sequences are spin-echo EPI pulse sequences.

11. The method as recited in claim 1, wherein step (c) includes reconstructing images from the acquired data and comparing the reconstructed images to the dictionary database.

12. The method as recited in claim 1, wherein step (c) includes computing simultaneously with the quantitative parameters, a radio frequency coil transmission homogeneity profile by comparing the acquired data with the values associated with flip angle homogeneity in the dictionary database.

13. The method as recited in claim 1, wherein the optimized acquisition parameters estimated in step (a) are symmetric with respect to time, such that in each pulse sequence performed in step (b) nuclear spin magnetization is at least partially rewound in that pulse sequence.

* * * * *

UNITED STATES PATENT AND TRADEMARK OFFICE
CERTIFICATE OF CORRECTION

PATENT NO. : 10,317,501 B2
APPLICATION NO. : 15/660221
DATED : June 11, 2019
INVENTOR(S) : Mathieu Sarracanie et al.

Page 1 of 1

It is certified that error appears in the above-identified patent and that said Letters Patent is hereby corrected as shown below:

In the Specification

Column 6, Line 24, "a" should be --α--.

Column 6, Line 27, "a" should be --α--.

Signed and Sealed this
Third Day of September, 2019

Andrei Iancu
*Director of the United States Patent and Trademark Office*